United States Patent [19]

Lee

[11] Patent Number: 4,877,504
[45] Date of Patent: Oct. 31, 1989

[54] METHODS FOR FABRICATING ELECTRO-OPTICALLY ACTIVE NIOBIUM DIOXIDE (NBO$_2$) THIN FILMS

[75] Inventor: James C. Lee, Plymouth, Minn.

[73] Assignee: Honeywell Inc., Minneapolis, Minn.

[21] Appl. No.: 86,858

[22] Filed: Aug. 19, 1987

Related U.S. Application Data

[62] Division of Ser. No. 717,261, Mar. 28, 1985, Pat. No. 4,712,857.

[51] Int. Cl.$^4$ .................. C23C 14/08; C23C 14/46
[52] U.S. Cl. ........................ 204/192.11; 204/192.26
[58] Field of Search .................. 204/192.11, 192.26, 204/192.22

[56] References Cited

U.S. PATENT DOCUMENTS 3,962,062  6/1976  Ingrey .................. 204/192.22

OTHER PUBLICATIONS

J. C. Lee et al., *J. Appl. Phys.*, vol. 56, pp. 3350–3352, (1984).
J. L. Vossen et al., "Thin Film Processes", Academic Press, New York, (1978), pp. 195–198.
A. Grill, *Vacuum*, vol. 33, pp. 329–332, (1983).
G. C. Vezzoli, *J. Appl. Phys.*, vol. 50, pp. 6390–6395, (1979).

*Primary Examiner*—Aaron Weisstuch
*Attorney, Agent, or Firm*—William T. Udseth; John G. Shudy, Jr.

[57] ABSTRACT

A reactive ion-beam sputtering technique for fabricating NbO$_2$ crystalline thin films suitable for use in these electro-optic devices.

10 Claims, 4 Drawing Sheets

CURRENT (20mA/VERTICAL DIVISION)

VOLTAGE (20 V/HORIZONTAL DIVISION)

100% TRANSMITTANCE LEVEL

200V/VERTICAL DIVISION 5 ms/HORIZONTAL DIVISION

0% TRANSMITTANCE LEVEL

200 V/VERTICAL DIVISION 5 ms/HORIZONTAL DIVISION

200 V/VERTICAL DIVISION 5 ms/HORIZONTAL DIVISION

200 V/VERTICAL DIVISION 5 ms/HORIZONTAL DIVISION 20 mA/VERTICAL DIVISION

200 V/HORIZONTAL DIVISION

4,877,504

METHODS FOR FABRICATING ELECTRO-OPTICALLY ACTIVE NIOBIUM DIOXIDE (NBO₂) THIN FILMS

The United States Government has rights in this invention pursuant to Contract No. DAAK70-83-C-0017, awarded by the Army.

This application is a division of application Ser. No. 717,261, filed Mar. 28, 1985 now U.S. Pat. No. 4,712,857 issued Dec. 15, 1987.

BACKGROUND OF THE INVENTION

1. Field of the Invention

This invention relates to means of electrically stimulating optical modulation switching in $NbO_2$ crystalline thin films and methods of fabricating such devices.

2. Related Art

Electrical switching in $NbO_2$ has been observed, particularly in the context of transient noise suppression applications. $NbO_2$ threshold switch devices capable of suppressing kilo volt-level pulses with nanosecond widths have been fabricated. On-to-off resistance ratios of nearly three orders of magnitude are reported. An electrically driven reversible semiconductor-to-metal phase transition is theorized as the basis for the electrical switching phenomena observed in $NbO_2$.

The electro-optic switching properties of $NbO_2$ however, have not heretofore been disclosed.

SUMMARY OF THE INVENTION

An electro-optic device includes a niobium dioxide ($NbO_2$) crystalline material, a light source for illuminating the crystalline material and means for applying an electric field, which can be varied, to the crystalline material, so that the intensity of the light (or electromagnetic energy) passing through the crystalline material will be a function of the applied electric field.

A reactive ion-beam sputtering technique for fabricating $NbO_2$ crystalline thin films suitable for use in these electro-optic devices is also disclosed.

BRIEF DESCRIPTION OF THE DRAWINGS

FIG. 6 displays the temporal response of the device of FIG. 1 in the setup of FIG. 4 with the lamp off and the drive on.

FIG. 7 displays the temporal response of the device of FIG. 1 in the setup of FIG. 4 with the lamp on and the drive on.

DESCRIPTION OF THE PREFERRED EMBODIMENT

Figure 1:
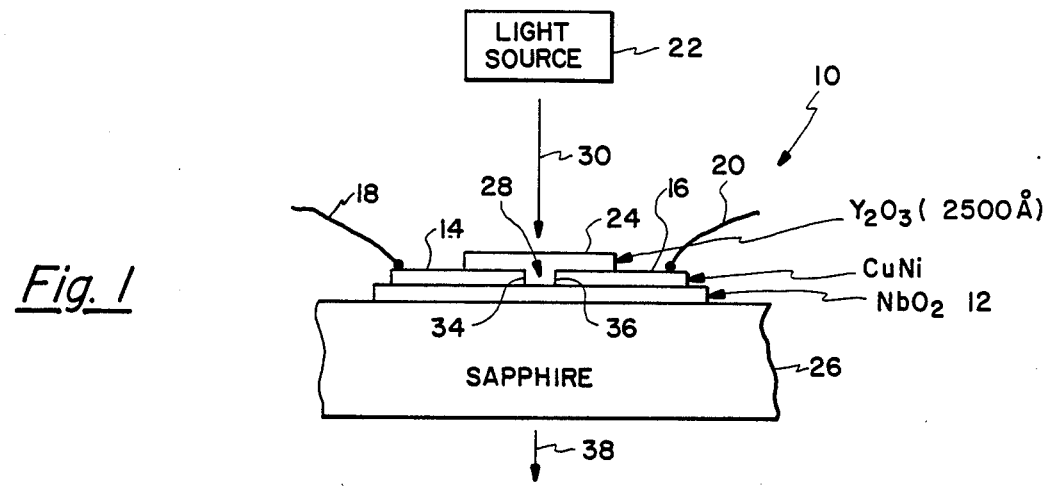
FIG. 1 is an electro-optic $NbO_2$ crystalline thin film device in accordance with the present invention.

Electro-optic $NbO_2$ device 10 of FIG. 1 includes an $NbO_2$ crystalline layer 12, means for applying an electric field to a portion of layer 12 (e.g., CuNi electrodes 14 and 16, and wires 18 and 20 connected to a power supply which is not shown), and an electromagnetic energy source (such as light source 22). It is preferable to further include a transparent passivation layer (such as $Y_2O_3$ layer 24) with layer 12 formed on a transparent substrate (such as sapphire 26). Electrodes 14 and 16 are spaced to provide an aperture 28 therebetween.

When a layer or material is referred to herein as "transparent", it means that the material will transmit with no substantial attenuation at least that portion of the electromagnetic spectrum of interest in a particular application.

In operation, source 22 illuminates aperture 28 with light beam 30. An electric field is generated between ends 34 and 36 of electrodes 14 and 16, respectively. In device 10 some of the field lines will curve through 180 degrees as they pass through layer 12. This curvature of field lines was employed in generating the data disclosed herein to insure that if anisotropic effects were associated with the observed electro-optic behavior, all directions in the $NbO_2$ layer were subjected to an electric field. The general electro-optic behavior herein disclosed will occur for any $\overline{E}$ field direction in crystalline layer 12, although some directions may enhance the effect.

With no electric field, the transmission of light through layer 12 (and transparent layer 24 and substrate 36) is basically unaffected resulting in an output beam 38 of a given intensity. As the strength of the electric field is increased, the transmission of light is increasingly attenuated until transmittance is virtually zero.

Figure 2:
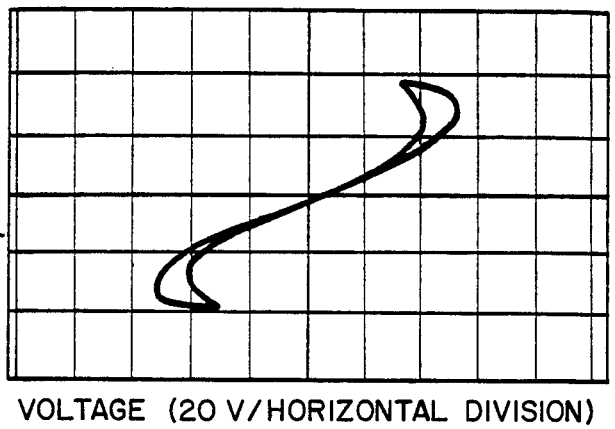
FIG. 2 displays the current-voltage characteristics of a circuit including a $NbO_2$ thin film as an electro-optic active element.

FIG. 2 shows the electrical switching behavior for device 10 with an aperture 28 of 0.1 millimeters by 1 millimeter. The current through layer 12 is shown as a function of the applied voltage. The looping in the trace is an instrumental artifact, due to uncompensated reactive pickup, and not device hysteresis. Nonlinear electrical switching behavior is clearly exhibited. The tips of the trace which turn inward indicate negative resistance regions.

Figure 3:
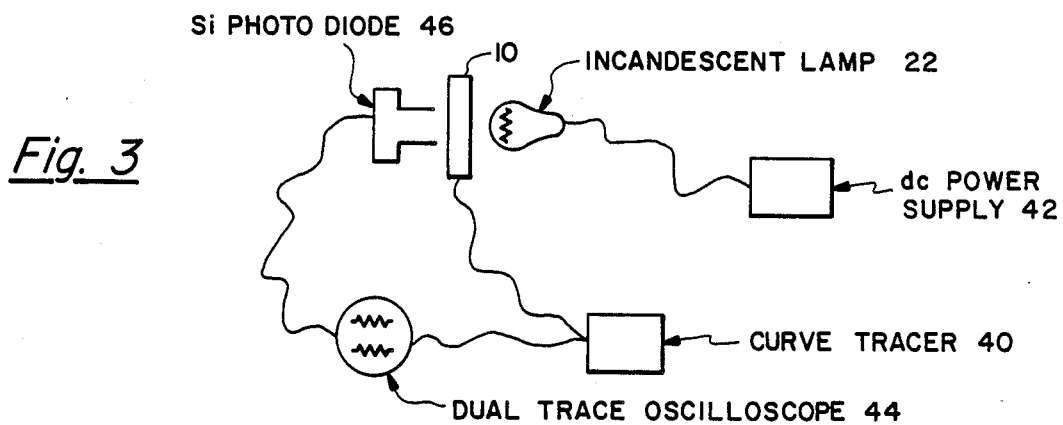
FIG. 3 is a test setup for the electro-optic behavior of the device of FIG. 1.

The electro-optic behavior of the present invention is demonstrated by the testing setup of FIG. 3 which includes device 10. Device 10 in this case had an aperture 28 which was 1 millimeter square. The electric field was supplied by a curve tracer 40 (a Tektronix 577 tracer was actually used). An incandescent lamp was used as electromagnetic source 22 in conjunction with a dc power supply 42. The data in FIGS. 4–7 was recorded using a dual trace oscilloscope 44. The intensity of output beam 38 was monitored with a Si photodiode 46. Layer 12 was a stoichometric $NbO_2$ thin film about 0.5 microns thick. FIGS. 4–7 show the photodiode 46 voltage signal and the drive voltage signal applied to electrodes 14 and 16 versus time.

Figure 4:
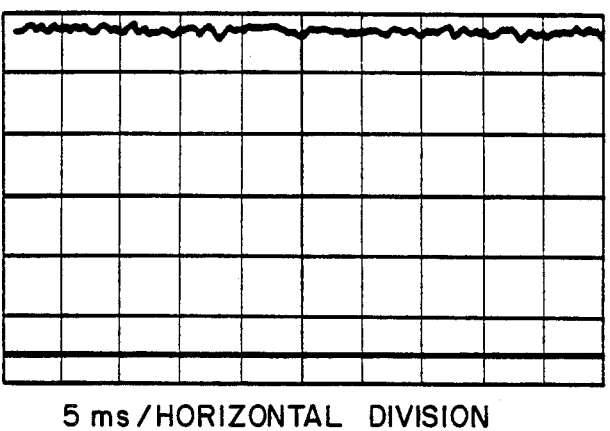
FIG. 4 displays the temporal response of the device of FIG. 1 using the setup of FIG. 4 with the lamp on and drive off.
Figure 5:
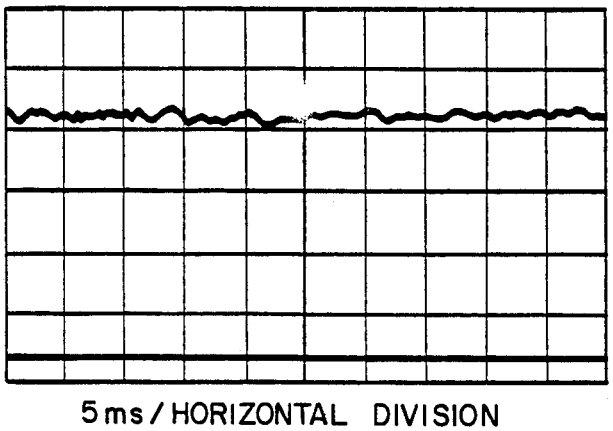
FIG. 5 displays the temporal response of the device of FIG. 1 in the setup of FIG. 4 with the lamp off and drive off.
Figure 6:
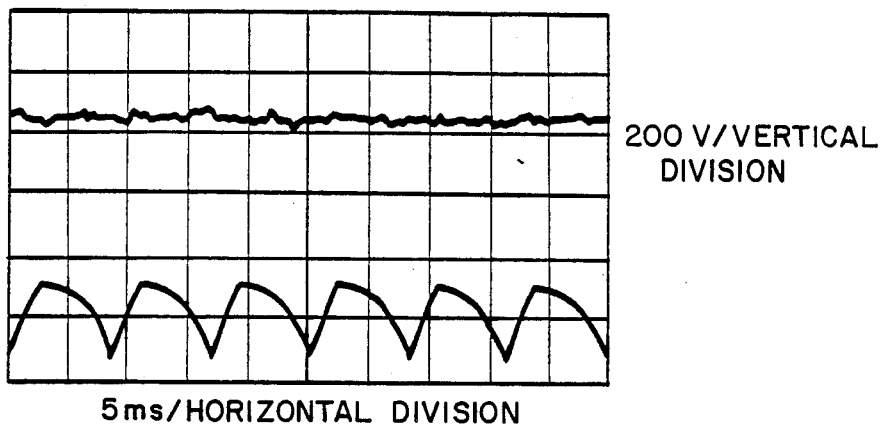
Figure 7:
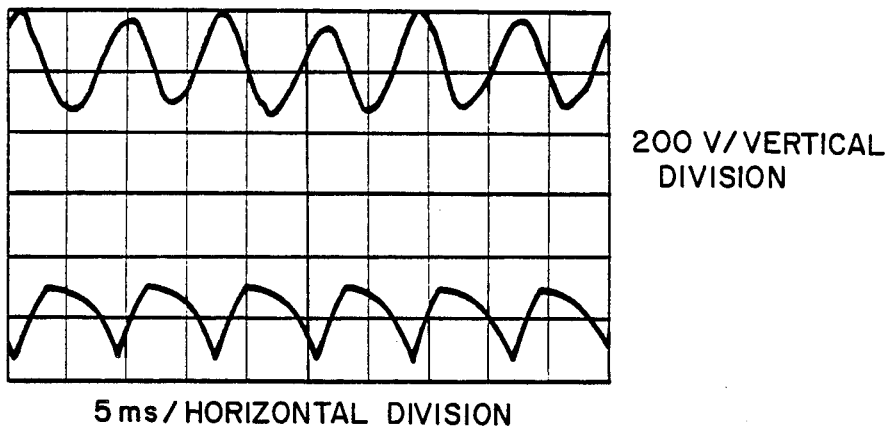

FIG. 4 shows where the 100 percent transmittance level (i.e., lamp on) was established with the $\overline{E}$ field being zero. FIG. 5 shows where the zero percent transmittance level (i.e., the lamp off) was established with the $\overline{E}$ field being zero. FIG. 6 shows the drive voltage with the light source 22 off. Note that the drive voltage has no effect on the zero transmittance level. Further, the rectified sine wave drive voltage is distorted due to the nonlinear load. FIG. 7 shows the temporal modulation response with the drive 40 and light source 22 on.

FIG. 7 clearly demonstrates that optical modulation/switching accompanies the electrical switching phenomenon observed for $NbO_2$.

Figure 8:
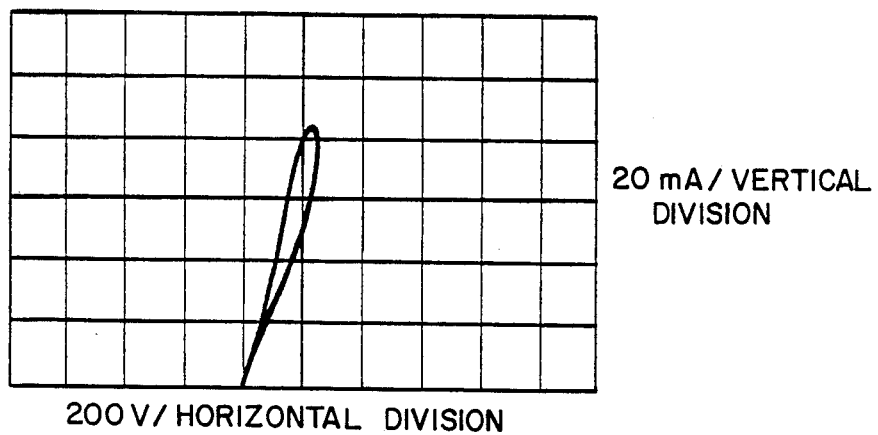
FIG. 8 displays the current-voltage characteristics of the $NbO_2$ thin film employed in FIGS. 4–7.

FIG. 8 shows the current-voltage characteristics for device 10 used to generate the data in FIGS. 4-7.

Figure 9:
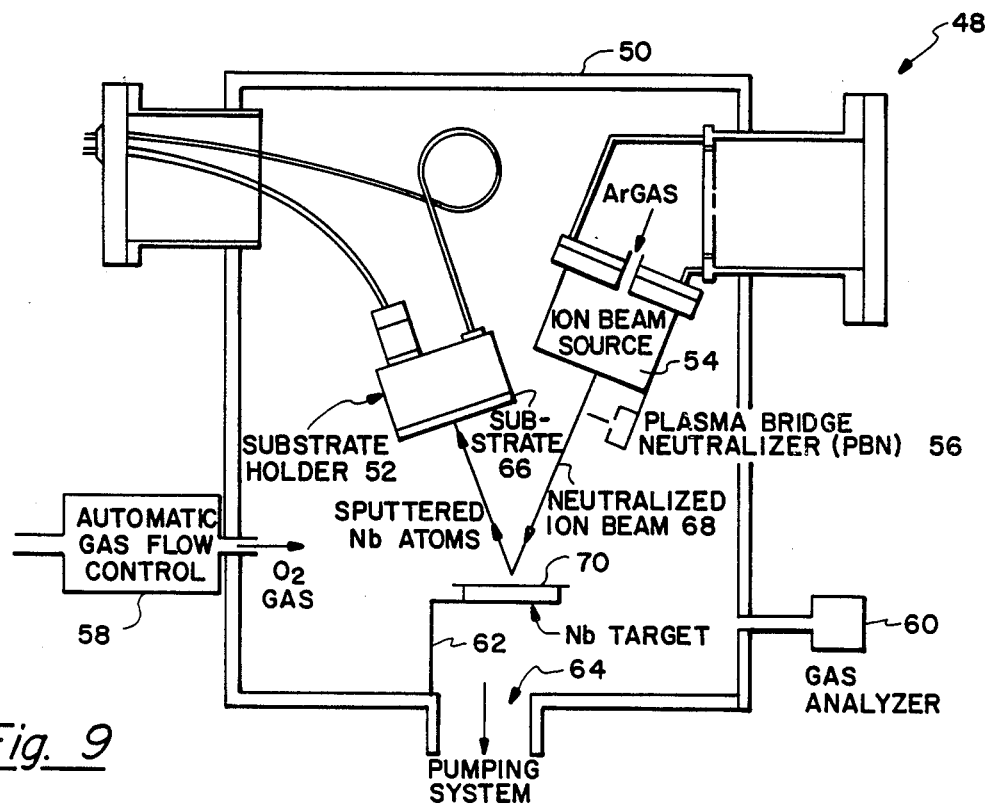
FIG. 9 shows an ion-beam sputtering system for $NbO_2$ deposition.
Figure 10:
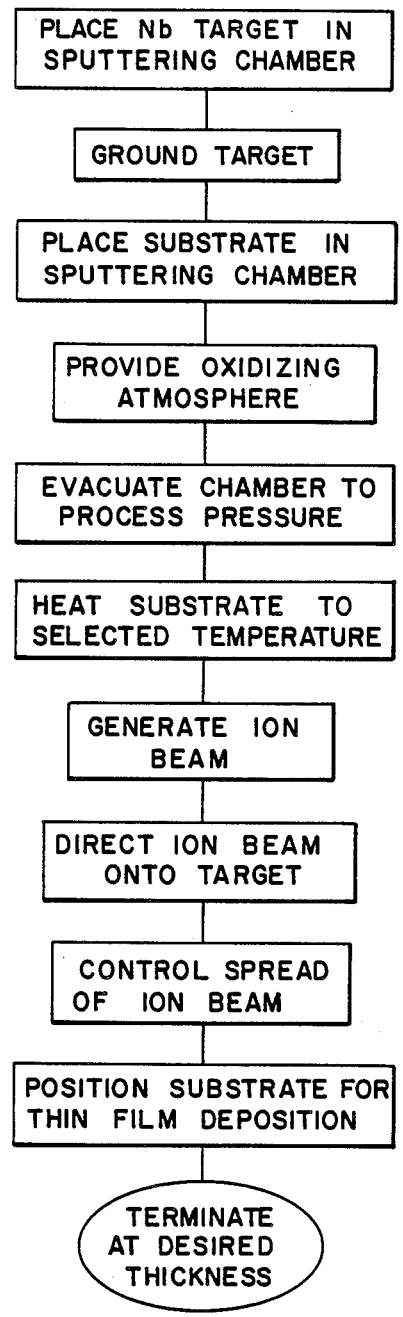
FIG. 10 is a flow diagram of the method of forming $NbO_2$ crystalline thin film on a solid substrate.

FIG. 9 is a schematic of a reactive ion-beam sputtering apparatus 48 used to make device 10. When used herein, "crystalline" means a material which exhibits long range order compared to the crystal lattice parameter. Apparatus 48 includes a hermetic chamber 50, substrate holder 52, ion-beam source 54, means for controlling the spread of the ion-beam (such as plasma bridge neutralizer 56), automatic gas flow control 58, gas analyzer 60, and target holder 62. An orifice 64 leads to a pumping system (not shown). Target holder 62 grounds the target (i.e., places it at a negative potential with respect to the ions). FIG. 10 is a flow diagram of the method of forming a $NbO_2$ crystalline thin film on a solid substrate.

In operation, an oxidizing atmosphere is provided within chamber 50. A good oxidizing atmosphere is $O_2$ mixed with Ar gas from the ion-beam source. The chamber is then evacuated to a pressure sufficient to allow sputtering of the $NbO_2$ thin film. Substrate 66 is heated to a temperature sufficient to allow an $NbO_2$ crystalline thin film to form on substrate 66.

Ion-beam 68 is generated by source 54. Typically Ar ions are employed. The ion beam is directed onto the Nb target 72 to sputter Nb atoms from it. Substrate 66 is positioned so that a majority of the sputtered Nb atoms strike substrate 66.

It is important to control the spread of ion-beam 68 in order to insure good quality $NbO_2$ crystalline thin films. Despite the fact that the target is a metal, beam spreading is a problem because the oxidizing atmosphere allows an oxide insulating layer to form on target 70. This in turn reduces the attractive force between the target and the ions in beam 68 which exaccerbates beam spreading. Beam spreading can be effectively controlled by, for example, neutralizing ion-beam 68 by injecting sufficient electrons into beam 68 to balance the positive charge. Plasma bridge neutralizer 56 was employed for this purpose.

The following parameters yielded $NbO_2$ crystalline thin films of about 0.5 microns on a sapphire substrate:

| Parameter | Value |
| --- | --- |
| Ion-beam voltage | 1.2 kV |
| Beam current (neutralized) | 50 mA |
| Beam current density at target | ~1 mA/cm$^2$ |
| $O_2$ and Ar background pressure | Low to mid $10^{-4}$ T |
| $O_2$/Ar flow rate | 0.08 to 0.09 |
| Deposition rate | 1 Å/sec |
| Temperature | 600° C. |

| Parameter | Value |
| --- | --- |
| Target - substrate Distance | 15 cm |

A temperature of 600° C. was essentially the lowest temperature at which apparatus 48 operating with the above parameters could product acceptable $NbO_2$ crystalline thin films. The lowest temperature sufficient for formation of crystalline thin films is preferable because the additional energy associated with higher temperatures can cause inhomogenous thin films.

Standard photolithographic techniques were used for fabrication of the remainder of device 10, with ion milling used to pattern the $NbO_2$ films.

What is claimed is:

1. A method of forming an electro-optically switchable niobium dioxide ($NbO_2$) crystalline thin film on a solid substrate by reactive ion-beam sputtering in a hermetic chamber, comprising:
    placing a niobium (Nb) target in said chamber;
    grounding said target;
    placing said substrate in said chamber;
    providing an oxidizing background atmosphere in said chamber;
    evacuating said chamber to a pressure sufficient for said sputtering process;
    heating said substrate to a temperature sufficient to allow said crystalline thin film to form on said substrate;
    generating an ion-beam from a source;
    directing said ion-beam onto said target so that Nb atoms are sputtered from said target;
    controlling the spread of said ion-beam as said beam travels from said source to said target; and
    positioning said substrate so that the majority of said Nb atoms sputtered from said target strike said substrate, thereby forming said electro-optically switchable thin film of $NbO_2$ on said substrate.

2. The method of claim 1 wherein said pressure sufficient for said sputtering process is less than $10^{-3}$T.

3. The method of claim 1 wherein said substrate is heated to approximately 600° C.

4. The method of claim 1 wherein said controlling the spread of said ion-beam includes injecting electrons into said ion-beam.

5. The method of claim 1 wherein said ion-beam is comprised of argon ions.

6. The method of claim 1 wherein said oxidizing atmosphere is comprised of $O_2$ and argon.

7. The method of claim 1 wherein the current density of said ion beam at said target is approximately 1 mA/cm$^2$.

8. The method of claim 1 further including depositing an $NbO_2$ layer on said substrate at a rate of approximately 1 Å/sec.

9. The method of claim 1 wherein said ion-beam has an energy of approximately 1200 electron volts.

10. The method of claim 1 wherein the target to substrate distance is approximately 15 cm.

* * * * *